US00RE34375E

United States Patent [19]

Mackintosh

[11] E Patent Number: Re. 34,375

[45] Reissued Date of Patent: Sep. 14, 1993

[54] SYSTEM FOR CONTROLLING APPARATUS FOR GROWING TUBULAR CRYSTALLINE BODIES

[75] Inventor: Brian H. Mackintosh, Concord, Mass.

[73] Assignee: Mobil Solar Energy Corporation, Billerica, Mass.

[21] Appl. No.: 758,559

[22] Filed: Sep. 12, 1991

Related U.S. Patent Documents

Reissue of:

[64] Patent No.: 4,936,947
Issued: Jun. 26, 1990
Appl. No.: 359,506
Filed: Jun. 1, 1989

Certificate of Correction issued Aug. 17, 1991.

U.S. Applications:

[63] Continuation of Ser. No. 46,991, May 5, 1987, abandoned.

[51] Int. Cl.[5] ..... B01D 9/00

[52] U.S. Cl. ..... 156/601; 423/DIG. 5; 422/249; 164/122.2; 164/154

[58] Field of Search ..... 156/601; 423/DIG. 5; 422/249; 164/122.2, 154

[56] References Cited

U.S. PATENT DOCUMENTS

| | | | |
|---|---|---|---|
| 3,934,983 | 1/1976 | Bardsley et al. | 156/601 |
| 4,185,076 | 1/1980 | Hatch et al. | 156/601 |
| 4,239,538 | 12/1980 | Hatch et al. | 156/601 |
| 4,242,589 | 12/1980 | Sachs | 156/601 |
| 4,277,441 | 7/1981 | Sachs | 156/601 |
| 4,290,835 | 9/1981 | Yates et al. | 156/601 |
| 4,318,769 | 3/1982 | Sachs | 156/601 |
| 4,440,728 | 4/1984 | Stormont | 156/DIG. 8 |
| 4,512,954 | 4/1985 | Matsui | 156/601 |
| 4,539,067 | 9/1985 | Washizuka et al. | 156/601 |
| 4,544,528 | 10/1985 | Stormont et al. | 156/DIG. 73 |
| 4,660,149 | 4/1987 | Lissadale et al. | 156/601 |
| 4,704,257 | 11/1987 | Tomizawa et al. | 156/617.1 |

FOREIGN PATENT DOCUMENTS

| | | | |
|---|---|---|---|
| 56572 | 7/1982 | European Pat. Off. . | |
| 115121 | 8/1984 | European Pat. Off. . | |
| 142415 | 8/1985 | European Pat. Off. . | |
| 1378402 | 12/1964 | France . | |
| 2071788 | 9/1971 | France . | |
| 55-158198 | 12/1980 | Japan . | |
| 61-158887 | 7/1986 | Japan | 156/601 |
| 2140704 | 12/1984 | United Kingdom . | |

OTHER PUBLICATIONS

Zinnes et al. "Automatic Diameter Control of Czochralski Grown Crystals" Journal of Crystal Growth 19(1973) pp. 187–192.

Process Instrumentation Manual, reprinted from Hydrocarbon Processing, Gulf Publishing Co., 1968, pp. 69–72.

"Monitoring Diameter of Semiconductor Crystals During Automated Growth", IBM Tech. Disclosure Bulletin, vol. 19, No. 3, pp. 869–870 (Aug. 1976).

"Growth of Large Diameter GaP Single Crystal by Computer Controlled LEC Technique", Inst. Phys. Conf. Series, No. 63, Chapter 1, pp. 43–46 (1981).

Taylor et al. "Current Status of EFG Crystal Growth Tech . . . ", North Holland Pub. Co., Amsterdam (1981).

*Primary Examiner*—Robert Kunemund
*Attorney, Agent, or Firm*—Pandiscio & Pandiscio

[57] ABSTRACT

A control system for controlling the operation of an apparatus for growing tubular crystalline bodies. The control system comprises a weight sensor for measuring the weight of the crystal, a length sensor for measuring the length of the crystal, a pressure sensor for measuring the pressure inside the crystal, and a controller coupled to the weight, length and pressure sensors for controlling the operation of the crystal growing apparatus. The controller is coupled to the die heater of the apparatus for controlling the temperature of melt contained in the crucible of the apparatus based on the outputs of the weight, length and pressure sensors. To ensure the wall of the tubular crystalline body is maintained at a substantially uniform thickness, precise measurement of the weight of the body must be made. Compensation is provided by this invention for weight measurement errors that are created by pressure fluctuations within the tubular crystalline body.

19 Claims, 3 Drawing Sheets

SYSTEM FOR CONTROLLING APPARATUS FOR GROWING TUBULAR CRYSTALLINE BODIES

Matter enclosed in heavy brackets [ ] appears in the original patent but forms no part of this reissue specification; matter printed in italics indicates the additions made by reissue.

This application is a continuation of 07/046991, filed 5-5-87, now abandoned.

BACKGROUND OF THE INVENTION

1. Field of the Invention

This invention pertains to apparatus for growing crystals, and more particularly to control systems for controlling apparatus for growing tubular crystalline bodies.

2. Prior Art

Silicon sheet used in the fabrication of semiconductor devices is frequently formed from the flat sides of tubular crystalline bodies of the type having a plurality of sides, e.g. a nonagon crystal. Apparatus of the type described in U.S. Pat. No. 4,544,528 have been used to manufacture these crystalline bodies according to the edge-defined, film-fed growth process (the EFG process). Briefly, these apparatus comprise a crucible for containing a melt of the material to be grown (e.g., silicon), a capillary die for controlling the form and shape of the grown crystal, a heater for controlling the temperature of the die and melt, a seed support assembly for supporting the seed used in growing the crystal, and a pulling mechanism coupled to the seed support assembly for drawing the tubular crystalline body out of the melt.

To produce a commercially-satisfactory silicon substrate and to ensure the crystal growth process is not prematurely terminated by either detachment or by freeze-up of the tubular crystalline body, it is essential that crystal wall thickness of the growing body be closely controlled. In capillary die apparatus of the type disclosed in U.S. Pat. No. 4,544,528, it is well known that wall thickness of the growing crystalline body varies with the size and shape of the meniscus formed between the top of the die and the bottom of the growing body. Using this relationship between wall thickness and various geometric characteristics of the meniscus, a variety of devices incorporating optical systems, such as those disclosed in U.S. Pat. Nos. 4,239,583, 4,267,151 and 4,318,769, have been developed for controlling the operation of crystal-growing apparatus. These optics-based systems comprise an optical assembly for viewing the meniscus. Using information regarding the configuration of the meniscus obtained via the optical assembly, an operator adjusts the operation of the crystal-growing apparatus so as to produce a crystalline body having the desired wall thickness.

Although satisfactory wall thickness control may be achieved with the foregoing optical control systems, certain limitations exist with respect to the use of these systems. First, an operator must continuously monitor the configuration of the meniscus and adjust the operation of the crystal growing apparatus based on what he or she observes. To avoid human error, increase crystal growth rates, and reduce the costs associated with the use of a technician, it is desirable to automate the entire crystal growth operation. Second, with known optical control systems only a relatively small portion of the entire meniscus is observable. The configuration of this small portion is not necessarily representative of the configuration of the entire meniscus.

With known crystal growing apparatus of the type illustrated in U.S. Pat. No. 4,544,528, it has been difficult and impractical to grow crystalline bodies having a length greater than about 2 meters. This difficulty is caused, in part, by the necessity to exclude air from the interior of the growing tubular crystal body by filling the latter with an inert gas such as argon, and, in part, by the fact that convection currents are generated within this volume by large temperature differences existing therein.

More specifically, an inert gas, typically argon, is injected into the interior of the growing crystalline body so as to exclude ambient air from the interior of the body. Because inert gas is heavier that ambient air, in a crystalline body having a length greater than about 2 meters, the inert gas column inside the body attains sufficient length, and hence sufficient weight, so that the column tends to sink, thereby permitting ambient air to be drawn into the body through the top end thereof.

When measures are taken to prevent ambient air from entering the crystalline body, such as by capping the top end of the body, the deleterious effects of the convection currents generated within the body increase significantly. When the tube is capped, these convection currents cause pressure fluctuations within the crystalline body which make it difficult to control the operation of the crystal growing apparatus. As a result, growth of crystalline bodies having a uniform wall thickness and lengths greater than about 2 meters is problematic.

A significant portion of the total time required to grow a crystalline body is consumed in preparing the crystal growing apparatus for the growth procedure. Consequently, to improve process efficiency it is desirable to grow crystals having lengths greater than about 2 meters.

OBJECTS AND SUMMARY OF THE INVENTION

A primary object of the present invention is to overcome the foregoing disadvantages associated with known control systems for controlling the operation of apparatus for growing tubular crystals.

Another primary object of the present invention is to provide an improved control system for controlling the operation of an apparatus for growing tubular crystalline bodies having lengths greater than about 2 meters.

A further object of the invention is to provide an improved control system for controlling the operation of an apparatus for growing tubular crystalline bodies based on information provided by sensors regarding the weight and length of the crystalline body and the pressure in the interior of the crystalline body.

Yet another object of the invention is to provide a method of controlling an apparatus for growing a crystalline body so as to produce a crystalline body having a substantially uniform wall thickness.

These and other objects of the invention are achieved by a control system adapted for use with known apparatus for growing tubular crystalline bodies in which the seed holder of the apparatus is constructed so as to substantially prevent ambient air from entering the body. A preferred embodiment of the system comprises a pressure sensor for measuring the pressure in the interior of a tubular crystalline silicon body, a weight sensor for measuring the combined weight of the tubular silicon body and the seed holder assembly from which the body is supported, a length sensor for measuring the length of the tubular body, a true weight circuit coupled to the pressure and weight sensors for calculating the true weight of the tubular body, and a controller coupled to the length sensor and to the true weight circuit. Using the information provided by the length sensor and the true weight circuit, the controller controls the operation of the crucible heater of the crystal growing apparatus. By precisely adjusting the output of the crucible heater, the operation of the crystal growing apparatus is controlled so as to ensure that (1) the growing silicon crystalline body will have a substantially uniform wall thickness and (2) the body may be grown to a length of 6 meters or more.

BRIEF DESCRIPTION OF THE DRAWINGS

For a fuller understanding of the nature and objects of the present invention, reference should be made to the following detailed description taken in combination with the accompanying drawings wherein.

DETAILED DESCRIPTION OF THE INVENTION

Figure 1:
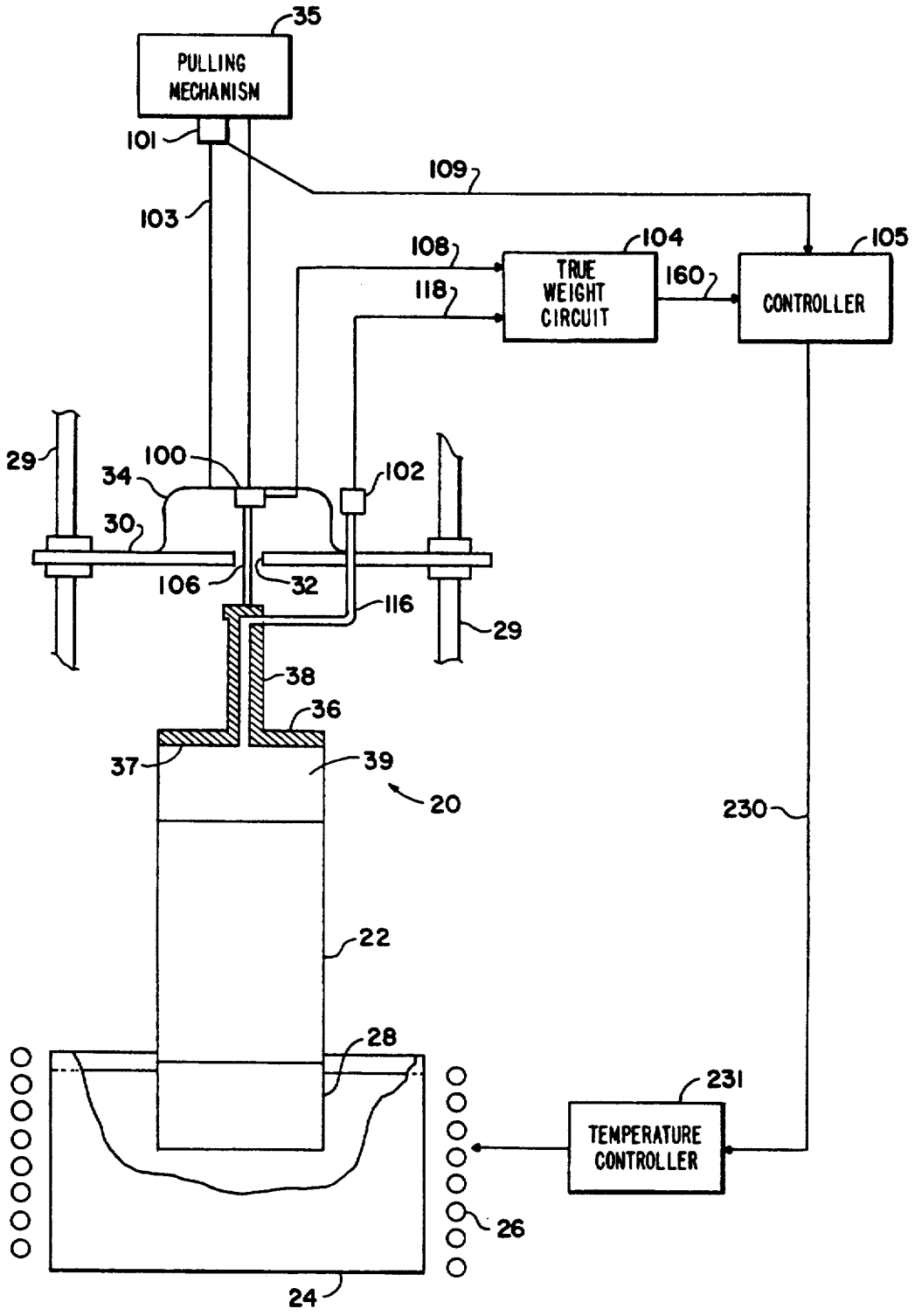
FIG. 1 is a schematic illustration, partly in section, of the preferred embodiment of the present invention.

Referring to FIG. 1, the present invention comprises a control system for controlling the operation of an apparatus 20 for growing tubular crystalline bodies 22 of semiconductor materials. Although not shown in detail, it is to be understood that apparatus 20 comprises a furnace of the type described and illustrated in U.S. Pat. Nos. 4,544,528, 4,239,583, 4,267,151 and 4,318,769. More specifically, apparatus 20 comprises a crucible 24 for containing a melt of the semiconductor material to be crystallized, a heater 26 for heating the melt, and a capillary die 28 of desired shape for forming the body 22. The capillary die may take various forms, but preferably it is in the form shown in FIG. 1 of the U.S. Pat. No. 4,544,528, except that it is shaped to grow a body of round or selected polygonal shape, e.g. a nonargon or an octagon. A pair of fixed parallel rails 29 and a frame 30 mounted for slidable movement thereon are provided for use in drawing a crystalline body 22 out of the melt. An aperture 32 (see drawing) is provided in frame 30 and an attachment plate 34 is secured to the frame adjacent the aperture. A pulling mechanism 35, of the type well known in the art, is supported above crucible 24 at a fixed location axially distal thereto and is coupled to frame 30 for pulling the latter along rails 29 and away from crucible 24 at a substantially constant rate of speed. Connected to frame 30 is seed holder 36. The latter is mechanically coupled to a seed crystal 39 (FIG. 1) from which crystalline body 22 is grown.

The foregoing brief description of apparatus 20 is sufficient for understanding the interrelationship between the control system of the present invention and the apparatus it controls. For a more detailed description of an exemplary one of apparatus 20, attention is directed to the aforementioned U.S. Pat. No. 4,544,528 issued to Stormont et al., which is incorporated herein by reference.

A preferred embodiment of the control system of the present invention comprises weight sensor 100, length sensor 101, pressure sensor 102, true weight circuit 104, and controller 105. In the preferred embodiment, seed holder 36 is constructed so as to substantially pneumatically block the upper end of the body so as to limit the quantity of fluid that can escape from the inside of the body through the upper end thereof. Seed holder 36 comprises a surface 37 that extends normally to the axis of tubular crystal 22 and a conduit 38 that fluidly couples the interior of crystal 22 with the exterior of the seed holder.

Weight sensor 100 is fixed to attachment plate 34 and is coupled to seed holder 36 by an axially extendible rod 106. The latter extends through aperture 32 in frame 30. Weight sensor 100 measures the weight of crystalline body 22 and seed holder 36, including seed 39. The output of weight sensor 100 is carried on line 108 to true weight circuit 104. Weight sensor 100 is a conventional strain gauge load cell.

Length sensor 101 is provided for measuring the displacement of frame 30 relative to fixed crucible 24. Length sensor 101 is attached to a fixed object, preferably to pulling mechanism 35, positioned above crucible 24. Length sensor 101 comprises a conventional drum and cable length measuring transducer. As pulling mechanism 35 pulls frame 30 along rails 29, cable 103 is wound around the drum. The amount of cable wound onto the drum corresponds to the length of the crystal and is measured by a potentiometer contained in the drum The output of the potentiometer of length sensor 101 is carried on line 109 to controller 105.

Pressure sensor 102 is provided for measuring the pressure inside crystalline body 22 acting upwardly against seed holder surface 37. Pressure sensor 102 is fluidly coupled to conduit 38 and hence to the interior of body 22 by a tube 116. Pressure sensor 102 may be mounted to attachment plate 34 or to any other suitable element. The output of pressure sensor 102 is transmitted on line 118 to true weight circuit 104. Pressure sensor 102 is a capacitive-type sensor.

Figure 2:
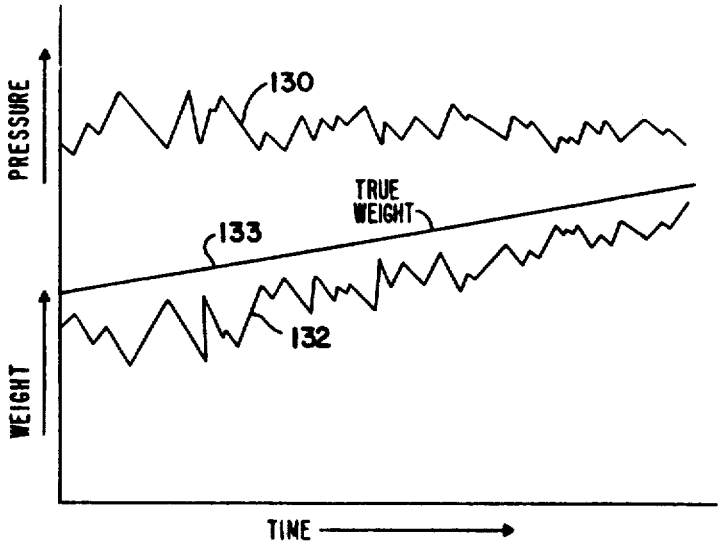
FIG. 2 is a chart that graphically illustrates the output, over time, of the pressure sensor and the weight sensor of the present invention relative to the true weight of the crystal.
Figure 3:
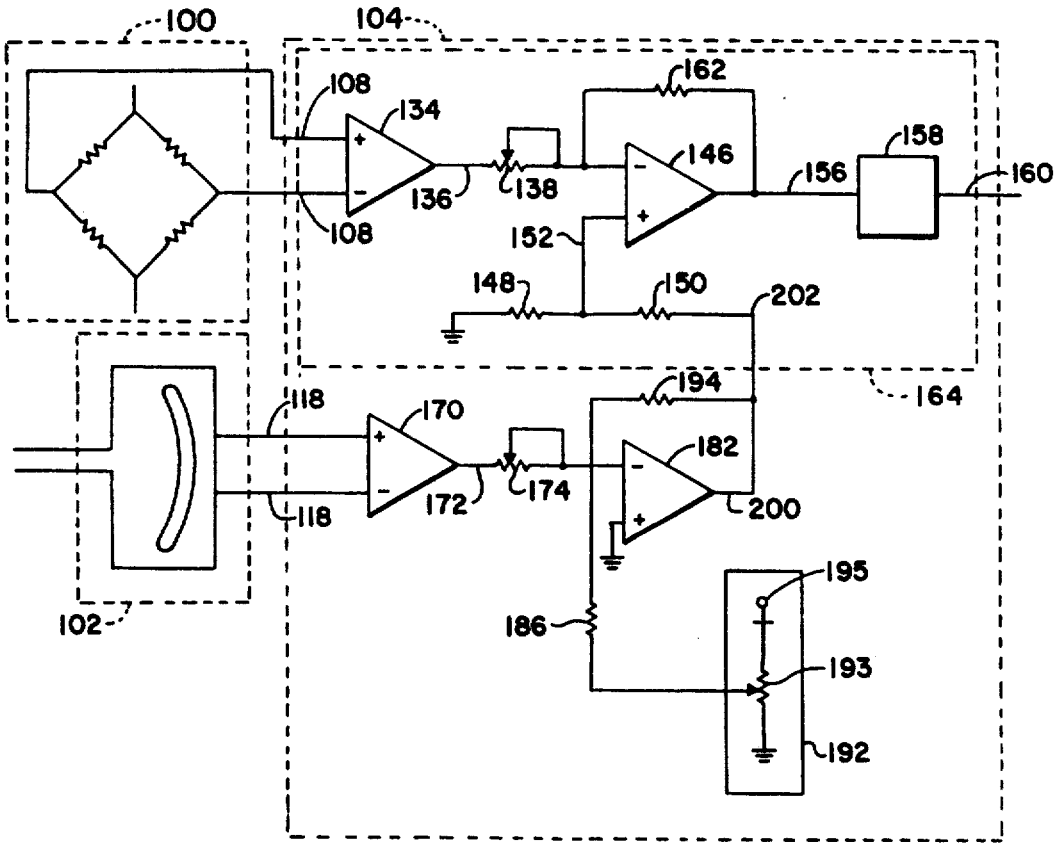
FIG. 3 is a circuit diagram of the true weight circuit employed in the preferred embodiment of the present invention.

Referring now to FIGS. 1-3, true weight circuit 104 is provided for continuously generating a signal that is representative of the true weight of growing crystalline body 22 at any selected interval during the crystal growth process. Briefly, true weight circuit 104 combines the outputs of weight sensor 100 and pressure sensor 102 to generate a signal that is representative of the true weight of growing crystalline silicon body 22, seed holder 36, and seed 39 An offset voltage signal is then subtracted from the true weight signal to provide a signal that is representative of the true weight of only the growing crystalline body 22.

However, the true weight of growing body 22 cannot be measured directly by weight sensor 100 due to pressure forces generated within the body that act upwardly against seed holder surface 37. When the force acting on surface 37 increases, the growing crystalline body 22 is lifted against the pull of gravity, causing the output signal of weight sensor 100, which is representative of the weight of crystal body 22, to decrease, as illustrated by the downward spikes in line 132 in FIG. 2. Likewise, when the force acting on surface 37 decreases, weight sensor 100 detects an increase in the weight of crystal body 22, as illustrated by the upward spikes in line 132 in FIG. 2. These variations in the output signal of weight sensor 100 reduce the accuracy of the control information generated by controller 105 The pressure fluctuations inside crystal body 22 measured by pressure sensor 102 vary in direct inverse relationship with the weight measurements made by weight sensor 100. By summing together the pressure and weight signals, as described in greater detail below, the true weight of crystalline body 22, illustrated by line 133 in FIG. 2, can be established. True weight circuit 104 is provided for generating this true representation of the weight.

By constructing seed holder 36 so that the latter and seed 38 substantially completely block off the end of crystal body 22, as noted above, the magnitude of the pressure fluctuations inside the body is greatly increased, as compared to the fluctuations that occur inside an unsealed crystal of the type grown with the apparatus disclosed in the aforementioned U.S. patent application No. 4,544,528. The errors in weight measurement that are consequent to these pressure fluctuations motivate the use of pressure sensor 102 and the true weight circuit 104.

Describing true weight circuit 104 shown in FIG. 3 in detail, the output of weight sensor 100 is connected via lines 108 to a amplifier 134. Amplifier 134 is connected by line 136 to weight calibration potentiometer 138. The latter is connected to the negative junction of summing amplifier 146. One terminal of a resistor 148 is connected by line 152 to the positive input junction of amplifier 146 and the other terminal of resistor 148 is connected to ground. One terminal of a resistor 150 is also connected via line 152 to the positive junction of amplifier 146. The other terminal of resistor 150 is connected to another portion of true weight circuit 104, as described below. The output of amplifier 146 is connected over line 156 to a filter 158, and the output of the latter is supplied over line 160 to controller 105. A resistor 162 is connected between output line 156 and the negative input terminal of amplifier 146 in the conventional configuration for summing amplifiers.

The foregoing elements 134–162, inclusive, provide signal conditioning of the output of weight sensor 100, as is well known in the art. Weight calibration potentiometer 138 is used to calibrate the output of true weight circuit 104 to accommodate variation in sensitivity of weight sensor 100.

The output of pressure sensor 102 is supplied on lines 118 to amplifier 170. The latter is connected on line 172 to pressure calibration potentiometer 174, which potentiometer is connected to the negative input junction of summing amplifier 182. The positive junction of amplifier 182 is connected to ground. Offset voltage source 192 is connected by resistor 186 to the negative input junction of summing amplifier 182. Offset voltage source 192 comprises a conventional potentiometer 193 and a suitable potential 195. A resistor 194 connects resistor 186 to the positive input terminal of amplifier 146, via resistor 150, in the conventional configuration for summing amplifiers. The polarity of the output signal of offset voltage source 192 is selected such that when the former signal is added to the output signal of weight sensor 100, through amplifier 182 and associated resistors 186, 194 and 150, the magnitude of the latter signal is reduced, as described in greater detail hereinafter. The output of amplifier 182 on line 200 is connected via line 202 to one terminal of resistor 150. As noted above, the other terminal of resistor 150 is connected via line 152 to the positive junction of amplifier 146.

An offset signal derived from voltage source 192 is combined with the output signal of pressure sensor 102 and the resultant signal is amplified by amplifier 182. The output signal of amplifier 182 is summed with the output signal of weight sensor 100 at summing amplifier 146. Weight calibration potentiometer 138 and pressure calibration potentiometer 174 are adjusted to scale the output signals of the weight sensor 100 and pressure sensor 102 respectively, so that at any point in time, the magnitude of the pressure signal on line 172 is equal and opposite to the portion of the weight signal on line 136 resulting from the pressure acting on seed holder surface 37. For instance, at a selected measurement interval, the output signal of weight sensor 100, as scaled by amplifier 134 and potentiometer 138, may be +1.5 v., and the output signal of pressure sensor 102, as scaled by amplifiers 170 and 182, and the associated resistances, may be −0.5 v. By adding the outputs of weight sensor 100 and pressure sensor 102 at amplifier 146, a summation of the output signals is obtained, i.e. +10 v., which is representative of the true weight of crystalline body 22, seed 39, and seed holder 36 at the selected measurement interval.

The output signal of offset voltage source 192, amplified through amplifier 182, results in an additional, constant signal which, when applied to amplifier 146, reduces the output of the latter by an amount corresponding to the weight of seed 39 and seed holder 36. As a consequence, the output signal of amplifier 146 represents the true weight of crystalline body 22.

The true weight signal on line 156 is finally processed through filter circuit 158, to attenuate undesirable components resulting from mechanical vibrations and electrical noise generated within the weight sensor. This signal is then conducted to controller 105 via line 160.

Controller 105 is provided for controlling the operation of crystal growing apparatus 20. In the preferred embodiment of the invention, pulling mechanism 35 is operated to draw crystalline body 22 out of crucible 24 at a constant rate of speed. Thus, operation of apparatus 20 may be controlled solely by adjusting the output of crucible heater 26. Controller 105 provides the temperature control signal used to effect this adjustment of crucible heater 26. Controller 105 may take one of a variety of forms including, for instance, an industrial process digital minicomputer.

Figure 4:
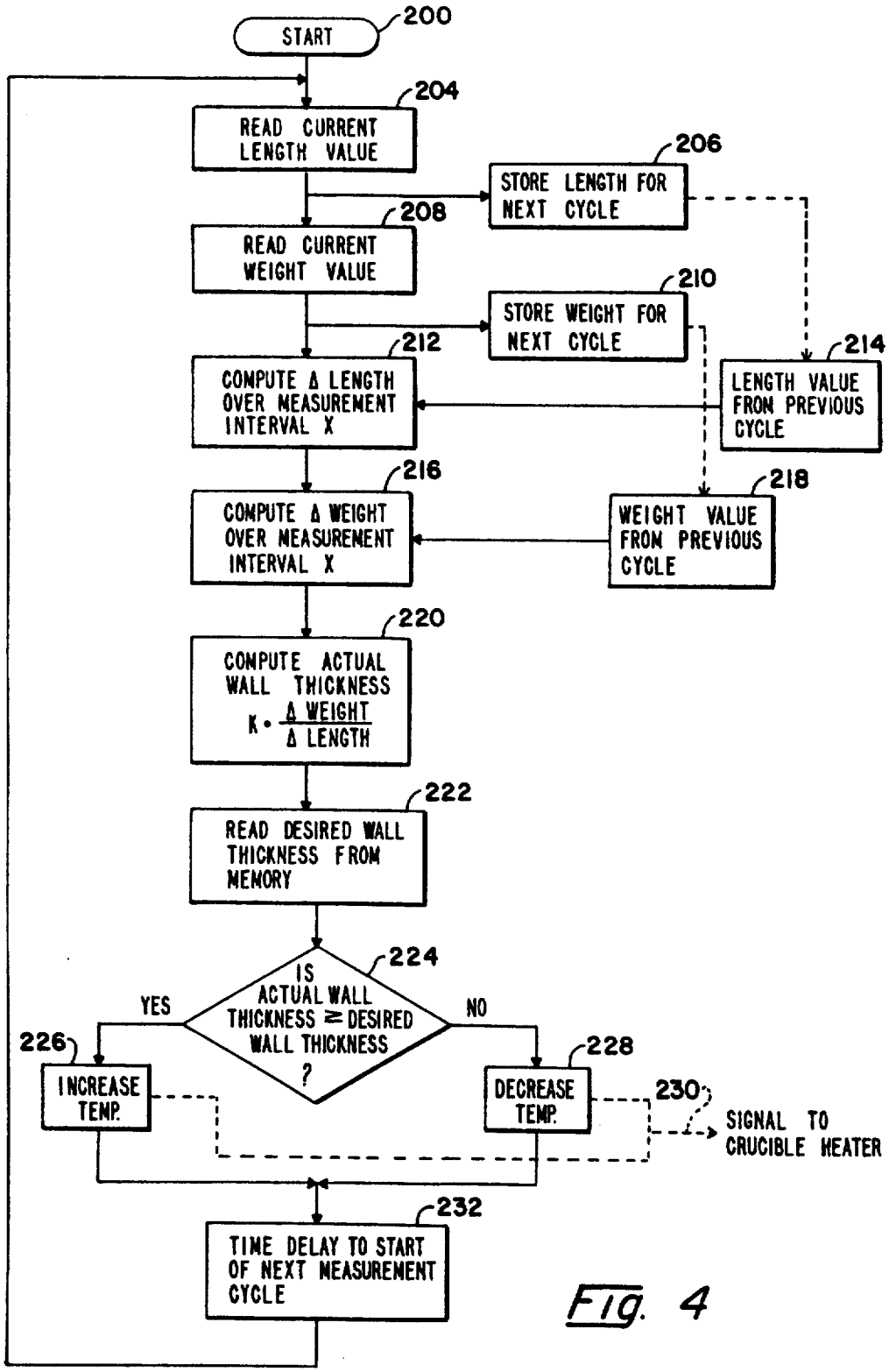
FIG. 4 is a software flow diagram illustrating the various operations performed by the control system of the present invention in controlling the operation of a crystal growing apparatus.

Turning now to FIGS. 1 and 4, controller 105, using input signal information provided thereto, controls the operation of crucible heater 26 in accordance with a machine control software program. The software flow diagram illustrated in FIG. 4 provides a logical outline of the operations performed by the software program. Line by line coding of the software program is not illustrated or described herein, as such coding is considered to be well within the skill of an ordinary practitioner.

As the first step in the flow diagram, the control system of the present invention is actuated so as to begin controlling the operation of apparatus 20, as illustrated by step 200. Next, controller 105 reads in the current length of crystalline body 22, as illustrated by step 204. Length transducer 101 provides this current length information over line 109 to controller 105. Next, at step 206, the current length information is stored for the next cycle. Thereafter, controller 105 reads in the current weight of crystalline body, as illustrated at step 208.

This current weight information is generated by true weight circuit 104 and is provided to controller 105 over line 160. Next, at step 210, the current weight information is stored for the next cycle.

Thereafter, the change in length of crystalline body 22 over measurement interval X is computed, as illustrated by step 212. This derivation is performed using current length data and length data from the previous measurement cycle. Current length data is supplied directly from length transducer 101 and previous cycle length data is read in, as illustrated by step 214, using the data stored at step 206. Clearly, during the first iteration of the flow diagram the length derivation information generated will be nonsensical because no previous cycle length data will have been generated. Measurement interval X preferably ranges between about 30 seconds and 3 minutes. Measurement interval X can be stored in controller 105 as a fixed setpoint or the interval can be entered as a control variable at the beginning of a crystal-growing operation.

Next, the change in weight of crystalline body 22 over the measurement interval X is computed, as illustrated by step 216. This derivation is performed using current weight data and weight data from the previous measurement cycle. Current weight data is supplied directly from true weight circuit 104 and previous cycle weight data is read in, as illustrated by step 218, using the data stored at step 210. As with step 212, weight derivation information generated during the first iteration will be nonsensical. Measurement interval X used in step 216 is identical to measurement interval X used in step 212, i.e., X preferably ranges from about 30 seconds to 3 minutes.

Then, at step 220, the actual wall thickness of crystalline body 22 is calculated by multiplying a constant, K, by the change in weight of the crystalline body calculated in step 216 and then dividing this product by the change in length of body 22 calculated in step 212. As one skilled in the art will recognize, K is a wall thickness conversion constant that is selected on the basis of the desired wall thickness of the crystalline body to be grown and the magnitude of the output signal of length sensor 100 and true weight circuit 104.

Next, desired wall thickness information is read from memory, as illustrated by step 222. Thereafter, at step 224, the actual wall thickness calculated at step 220 is compared to the desired wall thickness read in at step 222 to determine if the actual wall thickness is greater than or equal to the desired wall thickness. If the actual wall thickness is greater than or equal to the desired wall thickness, the flow diagram proceeds to step 226, whereat controller 105 generates a temperature increase signal that is supplied on line 230 to crucible heater 26. Upon receipt of this increase signal, crucible heater 26 will operate so as to elevate the temperature of the melt, which in turn will cause the wall thickness of the crystalline body 22 to decrease. If the actual wall thickness is not greater than or equal to the desired wall thickness, the flow diagram proceeds to step 228, whereat controller generates a temperature decrease signal that is supplied on line 230 to crucible heater 26. Upon receipt of this decrease signal, crucible heater 26 will operate so as to allow the temperature of the melt to decrease which, in turn, will cause the wall thickness of the crystalline body 22 to increase. In practice, because the wall thickness of crystal body 22 tends to decrease as the length of the body increases, the temperature of die 28 is typically decreased as the crystal grows longer by decreasing the output of crucible heater 26.

The nature of the signal provided by controller 105 and the manner in which crucible heater 26 processes the signal provided by the controller so as to adjust the temperature of the die and melt is immaterial to the present invention. Nevertheless, crucible heater 26 may, for instance, comprise a stepping heater, the output of which is adjustable stepwise. Thus, upon receipt of a positive signal from controller 105 the thermal output of heater 26 will increase by an amount Y, and upon receipt of a negative signal from controller 105 of output of heater 26 will decrease by an amount Y. Optionally, a conventional temperature controller 231 may be coupled between crucible heater 26 and output line 230, as illustrated in FIG. 1. Based on the output signal from on line 230 from controller 105, the temperature controller 231 varies the power input to crucible heater 26 so as to ensure a crystalline body 22 having a substantially uniform wall thickness is grown.

At the final step 232, a time delay is introduced before the next current length and weight values are read in. Because steps 204–228 are typically performed in less time than exists in a measurement interval, step 232 is provided to allow the remaining time in a measurement interval to run out before the next length and weight values are read in.

At the end of the time delay, the foregoing steps of the software flow diagram are repeated beginning with step 204.

The present invention is adapted to control the operation of known crystal growing apparatus with greater accuracy than is typically obtainable with known control systems. By controlling accurately the operation of known crystal growing apparatus, several important advantages are achieved. First, the frequency with which a growing crystalline body 22 will detach from, or freeze to, the die is greatly reduced. Second, the wall thickness of the tubular crystalline body is more accurately controlled. Third, crystal bodies 22 having lengths of up to 6 meters or more can be grown with relatively constant wall thickness using known crystal growing apparatus controlled by the present invention and modified so as to substantially pneumatically seal the top end of the crystal being grown. Material costs for silicon sheet produced from long crystalline bodies,, e.g. bodies 6 meters long, are significantly less than for sheet produced from the relatively short crystalline bodies that are grown with known crystal growing apparatus, due to the avoidance of losses due to freeze-ups and detachment, and due to the reduction in apparatus start-up time relative to the length of crystal grown.

Although the present invention is designed to control the operation of EFG crystal growing furnace apparatus of the type disclosed in the aforementioned U.S. Pat. No. 4,544,528, it is to be appreciated that the present invention may be adapted to control the operation of other furnace apparatus for growing hollow crystalline bodies.

While the invention is preferably designed to vary the heating rate of the crucible so as to control wall thickness (the pulling speed being held substantially constant), the invention may be designed so that the heating rate is held constant and the pulling speed is varied so as to control wall thickness. Alternatively, both the heating rate and pulling speed may be varied so as to produce a crystal having a substantially uniform wall thickness.

Since certain changes may be made in the above apparatus without departing from the scope of the present invention, it is intended that all matter contained in the above description or shown in the accompanying drawing shall be interpreted in an illustrative and not in a limiting sense.

What is claimed is:

1. A system for controlling the operation of an apparatus for growing a tubular crystalline body, the apparatus comprising a crucible for containing a melt, heating means for heating said crucible, growing means for growing a tubular crystalline body from said melt, said growing means comprising (1) seed holder means for supporting a seed onto which said crystalline body is grown and (2) pulling means for pulling said tubular crystalline body and said seed holder means away from said crucible, said the system comprising:

length sensor means for generating an output signal that is representative of the length of said growing tubular crystalline body;

weight sensor means for generating an output signal that is representative of the weight of said growing tubular crystalline body, said seed, and said seed holder means;

pressure sensor means for generating an output signal that is representative of the pressure inside said body; and controller means coupled to said length sensor means, said weight sensor means, said pressure sensor means, and said heating means for controlling the operation of said apparatus responsive to the output signals of the length sensor means, said weight sensor means, and said pressure sensor means, so as to ensure that said growing tubular crystalline body has a substantially uniform wall thickness.

2. A system according to claim 1, wherein said controller means controls the operation of said heating means.

3. A system according to claim 2, wherein said controller means comprises means for calculating the true weight of said tubular crystalline body and for generating a corrected output signal that is representative of the true weight of said tubular crystalline body, and further wherein said controller means controls the operation of said crucible heating means responsive to the output signals of said length sensor means and said calculating means.

4. A system according to claim 3, wherein said calculating means comprises:

means for combining the output signals of said weight sensor means and said pressure sensor means so as to generate a resultant signal that is representative of the true weight of said tubular crystalline body and said seed holder means;

means for generating an offset output signal that is representative of the true weight of said seed holder means; and means for combining said resultant signal and said offset output signal so as to generate said corrected output signal that is representative of the true weight of said tubular crystalline body.

5. A system according to claim 2, wherein said controller means comprises means for calculating the actual wall thickness of said tubular crystalline body at any selected measurement interval.

6. A system according to claim 5, wherein said controller comprises:

means for providing a desired wall thickness value; and means for comparing said desired wall thickness value with said actual wall thickness and for applying (1) a first signal to said heating means when said desired wall thickness value is less than said actual wall thickness and (2) a second signal to said heating means when said desired wall thickness value is greater than or equal to said actual wall thickness.

7. A system according to claim 1, wherein said seed holder means is constructed so as to substantially pneumatically block an upper end of said tubular crystalline body, and said pressure sensor means is adapted to measure pressure forces inside said tubular crystalline body acting upwardly on said seed-holder means.

8. A system according to claim 1, wherein said controller means controls the operation of said crucible heating means so as to permit said tubular crystalline body to be grown to a length of 6 meters or more.

9. A system according to claim 1, further wherein said pulling means pulls said tubular crystalline body, said seed, and said seed holder means away from said melt at a substantially uniform rate of speed.

10. An apparatus for growing a tubular crystalline body comprising:

a crucible for containing a melt;

means for heating said crucible;

means for forming said tubular crystalline body from said melt comprising (1) seed holder means for supporting a seed from which said crystalline body is grown and for substantially pneumatically closing off an upper end of said crystalline body and (2) pulling means for pulling said crystalline body, said seed, and said seed holder *means* away from said crucible;

length measuring means coupled to said forming means for providing an output signal that is representative of the length of said growing tubular crystalline body;

pressure measuring means coupled to said forming means for providing an output signal that is representative of the pressure inside said growing tubular crystalline body acting upwardly against said seed holder *means;* weight measuring means coupled to said forming means for providing an output signal that is representative of the weight of said growing tubular crystalline body; *and* controller means coupled to said length measuring means, said pressure measuring means, said weight measuring means, and said heating means, for controlling the operation of said heating means based on the output signals of said length measuring means, said pressure measuring means, and said weight measuring means, so as to ensure said crystalline body has a substantially uniform wall thickness.

11. An apparatus according to claim 10, further wherein said controller means comprises means for calculating the actual wall thickness of said tubular crystalline body at any measurement interval during the formation of said crystalline body.

12. A method for growing a tubular crystalline body having a substantially uniform wall thickness with an apparatus of the type including a crucible for containing a melt, heating means for heating said crucible, growing means for growing a tubular crystalline body from said melt, said growing means comprising (1) forming means in said crucible communicating with said melt for controlling the shape of said crystalline body, (2) seed holder means for supporting a seed onto which said crystalline body is grown and (3) pulling means for pulling said tubular crystalline body, said seed, and said seed holder means away from said forming means, the method comprising:

operating said apparatus so as to commence growing said tubular crystalline body out of said melt supported by said forming means;

measuring the current length of said tubular crystalline body and providing a change in length value that is representative of the change in length of said tubular crystalline body over a measurement time interval X;

*measuring the current weight of said tubular crystalline body and providing a change in weight value that is representative of the change in weight of said tubular crystalline body over said measurement time interval X;* computing and providing an actual wall thickness value that is representative of the actual wall thickness of said tubular crystalline body using said change in length value, said change in weight value, and a scaling factor constant K;

comparing said actual wall thickness value with a desired wall thickness value;

increasing the temperature of said heating means if said actual wall thickness value is greater than said desired wall thickness value; and decreasing the temperature of said heating means if said actual wall thickness value is less than said desired wall thickness value.

13. A system for controlling the operation of an apparatus for growing a hollow crystalline body, the apparatus comprising a crucible for containing a melt, heating means for heating said crucible, growing means including a forming means for growing a hollow crystalline body from said melt, said growing means comprising (1) seed holder means for supporting a seed onto which said hollow crystalline body is grown and (2) pulling means for pulling said hollow crystalline body, said seed, and said seed holder means away from said forming means at a selected rate of speed, said seed holder means being constructed so as to substantially pneumatically block an upper end of said hollow crystalline body, said system comprising:

length sensor means for generating an output signal that is representative of the length of said growing hollow crystalline body;

weight sensor means for generating an output signal that is representative of the weight of said hollow crystalline body, said seed, and seed holder means;

pressure sensor means for generating an output signal that is representative of the pressure forces inside said hollow crystalline body acting upwardly on said seed holder means;

controller means coupled to said length sensor means, said weight sensor means, said pressure sensor means, and said heating means for controlling the operation of said heating means responsive to the output signals of said length sensor means, said weight sensor means, and said pressure sensor means, so as to ensure that said growing hollow crystalline body has a substantially uniform wall thickness;

said controller means comprising calculating means responsive to output signals of said weight sensor means and said pressure sensor means for generating a resultant signal that is representative of the true weight of said hollow crystalline body, said seed, and said seed holder, means for generating an offset output signal that is representative of the true weight of said seed, and said seed holder means, means for combining said resultant signal and said offset output signal so as to generate a corrected output signal that is representative of the true weight of said tubular crystalline body, means responsive to said corrected output signal and said length sensor means output signal for generating an actual wall thickness signal that is representative of the actual wall thickness of said tubular crystalline body over a selected time, means for providing a reference signal representative of a desired wall thickness value, and means for comparing said reference wall thickness signal with said actual wall thickness signal and for applying (1) a first control signal to said heating means when said desired wall thickness value is less than said actual wall thickness and (2) a second control signal to said heating means when said desired wall thickness value is greater than said actual wall thickness.

14. Apparatus according to claim 10 having a capillary die associated with said crucible for determining the shape of said tubular crystalline body, and wherein said pulling means pulls said tubular crystalline body way from said die.

15. A method according to claim 12 wherein said forming means comprises a forming element of polygonal cross-sectional from which said tubular crystalline body is grown, and further wherein said apparatus is operated so that said tubular crystalline body has a polygonal cross sectional corresponding to the polygonal cross section of said forming element.

16. A method according to claim 12 further including the step of:

measuring the current pressure inside said tubular crystalline body and providing a change in pressure value that is representative of the change in pressure inside said tubular crystalline body over said measurement time interval X; and further wherein said computing step includes computing and providing said wall thickness value using said change in length value, said change in weight value, said change in pressure value, and said scaling factor constant K.

17. A method according to claim 16 wherein said computing step further includes the step of calculating a true weight value that is representative of the true weight of said crystalline body using said change in weight value and said change in pressure value.

18. A method of growing a tubular crystalline body having a substantially uniform wall thickness with an apparatus of the type including a crucible for containing a melt, heating means for heating said crucible, growing means for growing a tubular crystalline body from said melt, said growing means comprising (1) forming means in said crucible communicating with said melt for controlling the shape of said crystalline body, (2) seed holder means for supporting a seed onto which said crystalline body is grown and (3) pulling means for pulling said tubular crystalline body, said seed, and said seed holder means away from said forming means, the method comprising:

operating said apparatus so as to commence growing said tubular crystalline body out of said melt supported by said forming means;

measuring the current length of said tubular crystalline body and providing a change in length signal containing information which is representative of the change in length of said tubular crystalline body over a measurement time interval X;

measuring the current weight of said tubular crystalline body and providing a change in weight signal containing information which is representative of the change in weight of said tubular crystalline body over said measurement time interval X;

computing and providing an actual wall thickness signal containing information which is representative of the actual wall thickness of said tubular crystalline body using said change in length signal, said change in weight signal, and a scaling factor constant K;

providing a desired wall thickness signal containing information which is representative of a desired wall thickness and comparing said desired wall thickness signal with said actual wall thickness signal;

increasing the temperature of said heating means if said actual wall thickness[;], as represented in said information in said actual wall thickness signal, is greater than said desired wall thickness, as represented in said desired wall thickness signal; and decreasing the temperature of said heating means if said actual wall thickness, as represented in said actual wall thickness signal, is less than said desired wall thickness, as represented in said desired wall thickness signal.

19. An apparatus for growing a tubular crystalline body comprising:

a crucible for containing a melt;

heating means for heating said crucible;

growing means for growing a tubular crystalline body from said melt, said growing means comprising (1) seed holder means for supporting a seed onto which said crystalline body is grown and (2) pulling means for pulling said tubular crystalline body and said seed holder means away from crucible;

length sensor means for generating an output signal that is representative of the length of said growing tubular crystalline body;

weight sensor means for generating an output signal that is representative of the weight of said growing tubular crystalline body, said seed, and said seed holder means;

pressure sensor means for generating an output signal that is representative of the pressure inside said body; and controller means coupled to said length sensor means, said weight sensor means, said pressure sensor means, and said heating means for controlling the operation of said apparatus responsive to the output signals of said length sensor means, said weight sensor means, and said pressure sensor means, so as to ensure that said growing tubular crystalline body has a substantially uniform wall thickness.

* * * * *

UNITED STATES PATENT AND TRADEMARK OFFICE

CERTIFICATE OF CORRECTION

PATENT NO. : Re. 34,375

DATED : September 14, 1993

INVENTOR(S) : Brian H. Mackintosh

It is certified that error appears in the above-indentified patent and that said Letters Patent is hereby corrected as shown below:

Claim 1, column 9, line 17, delete "the";

Claim 12, column 10, line 63, delete "for" and insert -- of --;

Claim 15, column 12, line 33, delete "cross-sectional" and insert -- cross section --; and Claim 15, column 12, line 36, delete "cross sectional" and insert -- cross section --.

Signed and Sealed this

Fifth Day of April, 1994

Bruce Lehman

*Attest:*

BRUCE LEHMAN

*Attesting Officer*

*Commissioner of Patents and Trademarks*